United States Patent
Gonzalez

(10) Patent No.: US 7,053,651 B2
(45) Date of Patent: May 30, 2006

(54) LOW POWER CMOS SWITCHING

(75) Inventor: Jason Gonzalez, Fort Collins, CO (US)

(73) Assignee: Avago Technologies General IP Pte. Ltd., Singapore (SG)

( * ) Notice: Subject to any disclaimer, the term of this patent is extended or adjusted under 35 U.S.C. 154(b) by 107 days.

(21) Appl. No.: 10/941,187

(22) Filed: Sep. 15, 2004

(65) Prior Publication Data

US 2006/0055422 A1 Mar. 16, 2006

(51) Int. Cl.
- G06F 7/38 (2006.01)
- H03K 19/173 (2006.01)
- H03K 3/00 (2006.01)
- H03B 1/00 (2006.01)
- H03L 7/06 (2006.01)

(52) U.S. Cl. .......................... 326/38; 326/17; 326/21; 326/31; 327/111; 327/148; 327/157

(58) Field of Classification Search ................. 326/17, 326/21, 31, 104, 105, 38; 327/111, 148, 327/157

See application file for complete search history.

(56) References Cited

U.S. PATENT DOCUMENTS

| | | | |
|---|---|---|---|
| 4,342,927 A | 8/1982 | Hull | |
| 4,446,390 A | 5/1984 | Alaspa | |
| 5,406,141 A | 4/1995 | Yero et al. | |
| 5,424,656 A | 6/1995 | Gibson et al. | |
| 6,211,701 B1 | 4/2001 | Kuljik et al. | |
| 6,307,417 B1 | 10/2001 | Proebsting | |
| 6,369,632 B1 | 4/2002 | Barnes | |
| 6,456,126 B1 * | 9/2002 | Lo et al. | 327/116 |
| 6,483,886 B1 * | 11/2002 | Sung et al. | 375/376 |
| 6,526,374 B1 * | 2/2003 | Martin | 703/14 |

* cited by examiner

*Primary Examiner*—Rexford Barnie

(57) ABSTRACT

A CMOS switching circuit that includes a charge reservoir and a multiplexer connected to the charge reservoir. The multiplexer receives control signals from a delay line and a control signal line, and it delivers a switching signal to an output terminal. A first set of signals delivered to the control terminals of the multiplexer causes the charge reservoir to deliver charge to the output terminal, and a second set of signals delivered to the control terminals causes charging of the charge reservoir. With the charge reservoir, charge from falling signals is conserved and used to help rising signals at the output, reducing the power required to provide an output switching signal.

18 Claims, 1 Drawing Sheet

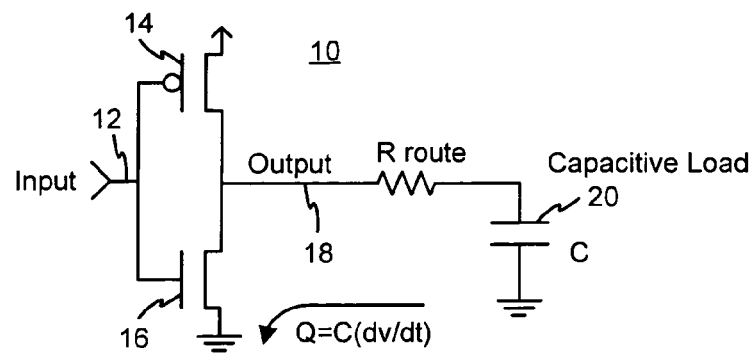
FIGURE 1: PRIOR ART
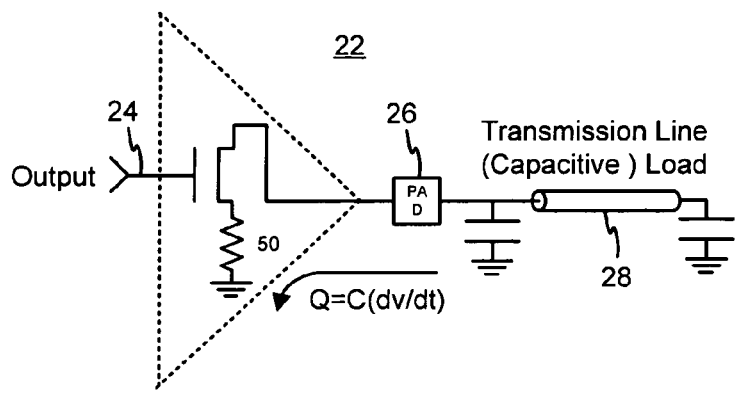
FIGURE 2: PRIOR ART
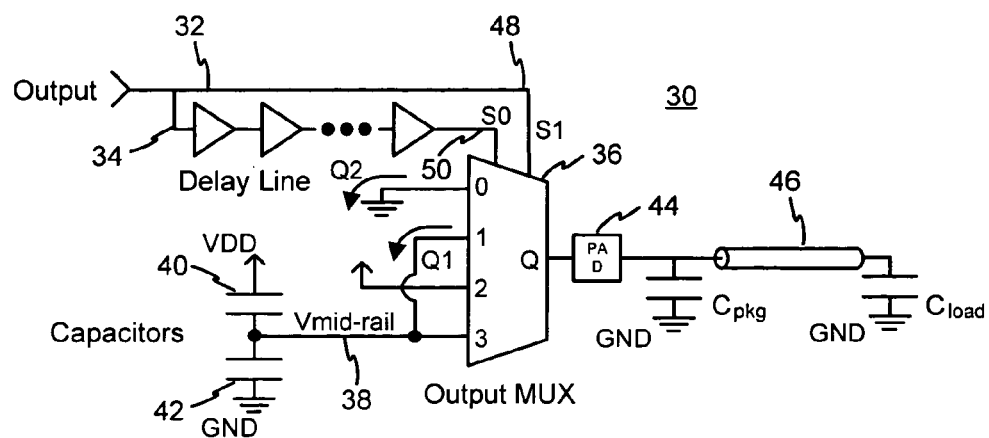
FIGURE 3

LOW POWER CMOS SWITCHING

BACKGROUND OF THE INVENTION

Complementary Metal Oxide Semiconductor (CMOS) circuits, especially large drivers as found in Input/Output (I/O) buffer designs, are required to output high and low levels. This requires transistors to pull voltage signals "up" for high level outputs and pull signals "down" for low level outputs. Large pull-up and pull-down field effect transistors (FETs) in totem pole drivers can be required for clock drivers and to generate fast edge rates required for high bandwidth connectivity. One disadvantage of these drivers are the large amounts of alternating current (AC) switching power that they require for their operation.

FIGS. 1 and 2 are circuit diagrams of prior art CMOS circuits. In FIG. 1, a circuit 10 illustrates the typical AC power consumption by a CMOS circuit. In circuit 10, an input signal on line 12 drives transistors 14 and 16. With a high input signal on line 12, transistor 14 turns off and transistor 16 turns on, driving an output low level on line 18. With a low input signal on line 12, transistor 14 turns on and transistor 16 turns off, driving an output high level on line 18. The output signal on line 18 drives a capacitive load 20. In FIG. 2, a circuit 22 illustrates the typical AC power consumption by a CMOS I/O buffer. In circuit 22, an output signal on line 24 drives a capacitive load 28 via a pad 26. Both exemplary CMOS circuits 10 and 22 require large amounts of AC switching power, which can be a particular disadvantage.

Accordingly, a need exists for improved circuit switching and, in particular, an improved CMOS switching circuit.

SUMMARY OF THE INVENTION

A switching circuit consistent with the present invention includes a charge reservoir and a control circuit connected to the charge reservoir. The control circuit receives signals at control terminals, and it delivers a switching signal to an output terminal. A first set of signals delivered to the control terminals causes the charge reservoir to deliver charge to the output terminal, and a second set of signals delivered to the control terminals causes charging of the charge reservoir. With the charge reservoir, charge from falling signals is conserved and used to help rising signals at the output, reducing the power required to provide an output switching signal.

BRIEF DESCRIPTION OF THE DRAWINGS

The accompanying drawings are incorporated in and constitute a part of this specification and, together with the description, explain the advantages and principles of the invention. In the drawings, FIG. 1 is a circuit diagram of an existing method for drive buffer pulling down;

FIG. 2 is a circuit diagram of an existing method for I/O drive buffer pulling down; and FIG. 3 is a circuit diagram for low power AC switching in accordance with an embodiment of the present invention.

DETAILED DESCRIPTION

Embodiments of the present invention can significantly reduce the amount of power dissipated by CMOS circuit switching. A switching circuit and method, consistent with the present invention, use less power and can be used to slow down edge rates for lower electromagnetic interference (EMI), less power supply noise, and better signal integrity of output drivers. Embodiments of the present invention can also reduce the switching noise induced on power supplies.

A CMOS switching circuit is used to transmit data. CMOS circuits can be used for many different applications such as, for example, to perform the following functions: invert signals; repeat signals; and perform logical operations such as AND, OR, NAND, NOR, XOR, or XNOR operations. A CMOS switching circuit can also be used as, for example, an I/O buffer. The purpose of an I/O CMOS circuit (buffer) is to communicate signals from a chip embodying the circuit to the hardware outside of the chip, and from the hardware to the chip embodying the circuit. Examples of that hardware include the board on which the chip is located, other chips, cables, or other hardware elements. Therefore, I/O CMOS circuits communicate data from the chips embodying the circuits to the environment outside of the chips, and from the outside environment to the chips. A CMOS switching circuit, consistent with the present invention, may be used on any chip that may have power constraints such as, for example, an Integrated Circuit (IC), application specific integrated circuit (ASIC), or central processing unit (CPU).

FIG. 3 is a diagram of a circuit 30 for low power AC switching in accordance with an embodiment of the present invention. Circuit components of this embodiment include a charge reservoir implemented in this example with capacitors 40 and 42, control input lines (a delay line 34 and a control signal line 32), and a control circuit implemented in this example with multiplexer (MUX) 36. The purpose of the capacitors 40 and 42 is to provide a mid-rail voltage 38 with a reservoir of charge to facilitate pulling output signals up from the ground (GND) connection and down from the power supply (VDD) connection at pad 44. In particular, the capacitors 40 and 42 deliver charge during rising outputs and collect charge during falling outputs.

The delay line 34 is used to control the transition point between using the mid-rail voltage 38 and the supply voltages for transitioning low-to-high or high-to-low. The output and delay lines 32 and 34 drive the output MUX select lines 48 (S1) and 50 (S0) to select the correct output voltage (supply voltage VDD or mid-rail reference voltage 38) during switching. The S1 and S0 signals (lines 48 and 50), used to control the MUX 36, are connected to the Output signal, which is the data bit being transmitted out from the chip containing circuit 30 to, for example, a pad or circuit board. In this example, the delay line 34 is implemented with a plurality of CMOS inverters connected in series.

Table 1 is a truth table which identifies how the circuit 30 functionally operates. When there are many I/O buffers or large CMOS inverters in parallel, they can benefit from each other's switching and conserver charge. Assuming half the output signals in circuit 30 are switching from VDD to GND and the other half from GND to VDD at any given time, and assuming they all drive the same size of load 46, then the charge placed on Vmid-rail 38 from the falling signals is conserved and used to help the rising signals rise from GND to Vmid-rail 38.

TABLE 1

| Output (Line 32) | S0 (50) | S1 (48) | PAD (44) |
|---|---|---|---|
| 0 | 0 | 0 | GND |
| 1 | 0 | 1 | Vmid-rail (38) |

TABLE 1-continued

| Output (Line 32) | S0 (50) | S1 (48) | PAD (44) |
|---|---|---|---|
| 1 | 1 | 1 | VDD |
| 0 | 1 | 0 | Vmid-rail (38) |
| 0 | 0 | 0 | GND |

While the present invention has been described in connection with an exemplary embodiment, it will be understood that many modifications will be readily apparent to those skilled in the art, and this application is intended to cover any adaptations or variations thereof. For example, different components for the various circuit elements may be used without departing from the scope of the invention. This invention should be limited only by the claims and equivalents thereof.

The invention claimed is:

1. A switching circuit, comprising:
   a charge reservoir;
   a delay line;
   a control signal line; and
   a multiplexer having inputs connected to the charge reservoir, control terminals connected to the delay line and the control signal line, and an output terminal for use in driving a load,
   wherein a first set of signals delivered to the control terminals of the multiplexer causes the charge reservoir to deliver charge to the output terminal and a second set of signals delivered to the control terminals of the multiplexer causes charging of the charge reservoir.

2. The switching circuit of claim 1 wherein the charge reservoir comprises a plurality of capacitors connected in series between a ground connection and a power supply connection.

3. The switching circuit of claim 1 wherein the delay line includes a plurality of inverters connected in series.

4. The switching circuit of claim 1 wherein the multiplexer has first and second inputs connected to the charge reservoir, a third input connected to a ground connection, and a fourth input connected to a power supply connection.

5. The switching circuit of claim 1 wherein:
   the charge reservoir comprises a pair of capacitors connected in series between a ground connection and a power supply connection; and
   the multiplexer has a pair of inputs connected between the pair of capacitors.

6. The switching circuit of claim 3 wherein the inverters of the delay line are each composed of a CMOS transistor.

7. A method providing an output switching signal, comprising:
   providing a charge reservoir;
   providing a multiplexer having a connection to the charge reservoir, control terminals, and an output terminal;
   delivering charge from the charge reservoir to the output terminal based upon a first set of signals delivered to the control terminals; and
   charging the charge reservoir based upon a second set of signals delivered to the control terminals.

8. The method of claim 7 wherein the providing the charge reservoir step includes connecting to the multiplexer a plurality of capacitors in series between a ground connection and a power supply connection.

9. The method of claim 7, further including providing a delay line to one of the control terminals of the multiplexer.

10. The method of claim 7, further including providing to the multiplexer first and second inputs connected to the charge reservoir, a third input connected to a ground connection, and a fourth input connected to a power supply connection.

11. A switching circuit, comprising:
    a charge reservoir;
    control input lines; and
    a control circuit having inputs connected to the charge reservoir, control terminals connected to the control input lines, and an output terminal for use in driving a load,
    wherein a first set of signals delivered to the control terminals of the control circuit causes the charge reservoir to deliver charge to the output terminal and a second set of signals delivered to the control terminals of the control circuit causes charging of the charge reservoir.

12. The switching circuit of claim 11 wherein the charge reservoir comprises a plurality of capacitors connected in series between a ground connection and a power supply connection.

13. The switching circuit of claim 11 wherein control input lines include a delay line.

14. The switching circuit of claim 13 wherein the delay line includes a plurality of inverters connected in series.

15. The switching circuit of claim 14 wherein the inverters of the delay line are each composed of a CMOS transistor.

16. The switching circuit of claim 11 wherein the control circuit has first and second inputs connected to the charge reservoir, a third input connected to a ground connection, and a fourth input connected to a power supply connection.

17. The switching circuit of claim 11 wherein:
    the charge reservoir comprises a pair of capacitors connected in series between a ground connection and a power supply connection; and
    the control circuit has a pair of inputs connected between the pair of capacitors.

18. The switching circuit of claim 11 wherein the control circuit includes a multiplexer.

* * * * *